(12) United States Patent
Whikehart

(10) Patent No.: US 6,445,735 B1
(45) Date of Patent: Sep. 3, 2002

(54) SWITCHED BANDWIDTH DIGITAL FILTERS WITH REDUCED TRANSIENTS DURING SWITCHING

(75) Inventor: J. William Whikehart, Novi, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/247,214

(22) Filed: Feb. 8, 1999

(51) Int. Cl.[7] .................................................. H03H 7/12
(52) U.S. Cl. ........................ 375/232; 708/323; 455/266; 455/307; 455/339; 455/340
(58) Field of Search ................... 375/229, 232, 375/233; 455/266, 307, 339, 340, 191.1, 191.3, 62, 63, 295, 296, 306; 708/300, 301, 322, 323, 311, 313, 425

(56) References Cited

U.S. PATENT DOCUMENTS

| | | | |
|---|---|---|---|
| 4,177,430 A | | 12/1979 | Paul |
| 4,339,828 A | * | 7/1982 | Chasek ........................ 455/205 |
| 4,352,208 A | | 9/1982 | Schroeder |
| 4,356,567 A | | 10/1982 | Eguchi et al. |
| 4,524,422 A | * | 6/1985 | Kasuga ........................ 375/232 |
| 5,155,862 A | | 10/1992 | Hansen |
| 5,287,556 A | | 2/1994 | Cahill |
| 5,303,413 A | | 4/1994 | Braegas |
| 5,307,515 A | | 4/1994 | Kuo et al. |
| 5,388,062 A | | 2/1995 | Knutson |
| 5,465,410 A | | 11/1995 | Hiben et al. |
| 5,493,717 A | | 2/1996 | Schwartz |
| 5,498,998 A | | 3/1996 | Gehrke et al. |
| 5,530,660 A | * | 6/1996 | Sun et al. .................... 708/300 |
| 5,612,978 A | | 3/1997 | Blanchard et al. |
| 5,617,480 A | | 4/1997 | Ballard et al. |
| 5,678,214 A | | 10/1997 | Azuma |
| 5,732,237 A | | 3/1998 | Wargnier et al. |
| 5,777,909 A | * | 7/1998 | Leung et al. ................ 708/300 |
| 6,271,720 B1 | * | 8/2001 | Sevastopoulos ............. 327/552 |

OTHER PUBLICATIONS

Richard J. Higgins, Digital Signal Processing in VLSI, Prentice–Hall, 1990, pp. 207–228.

* cited by examiner

Primary Examiner—Chi Pham
Assistant Examiner—Khan Cong Tran
(74) Attorney, Agent, or Firm—John E. Kajander

(57) ABSTRACT

A switched bandwidth filter in a digital signal processor selectively provides a first bandwidth characteristic or a second bandwidth characteristic by loading separate first and second sets of filter coefficients into the digital filter. The level of transients during coefficient switching is reduced by specially designing the respective coefficient sets using modifications obtained according to the invention. The modifications substantially match net gains at at least one of the internal nodes between filter sections provided by the first and second coefficient sets, respectively.

10 Claims, 4 Drawing Sheets

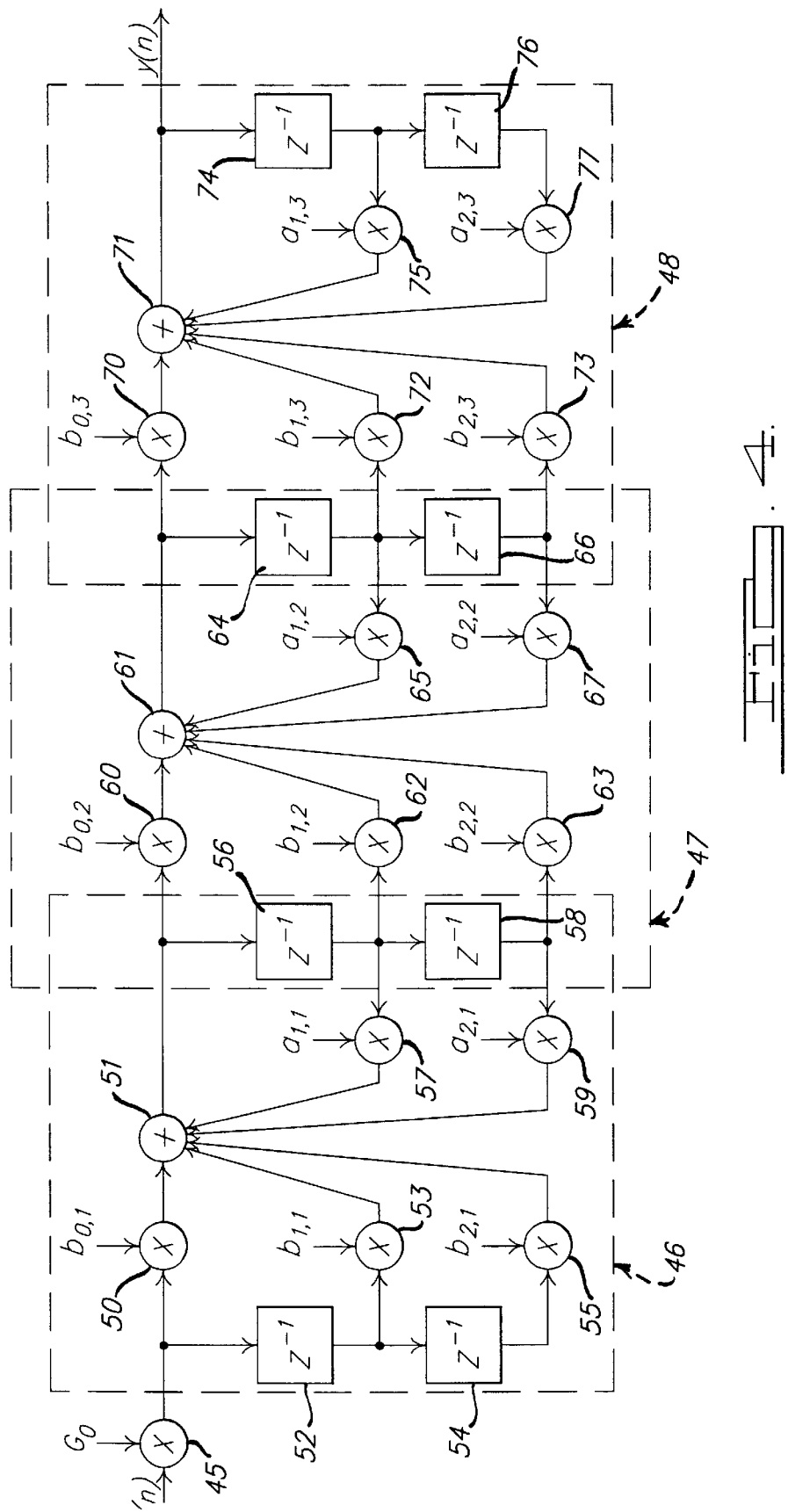

SWITCHED BANDWIDTH DIGITAL FILTERS WITH REDUCED TRANSIENTS DURING SWITCHING

BACKGROUND OF THE INVENTION

The present invention relates in general to switched bandwidth digital filters using swapped coefficient sets, and more specifically, to modifying coefficient sets to reduce switching transients at the output of the digital filter.

Digital filters manipulate discrete samples of an input signal to produce a filter output signal. Various filter structures are known in the art, such as those for finite impulse-response (FIR) filters and infinite impulse-response (IIR) filters. Higher order IIR filters (providing more selectivity) are typically implemented using a plurality of lower order filters connected in cascade.

During processing of a signal, it may become necessary to change the filtering of the signal (e.g., a change in bandwidth, passband characteristic, group delay, or other filter parameters). To minimize hardware and/or software requirements, it is desirable to use the same filter structure before and after the change by merely changing the digital filter coefficients.

After switching of the filter coefficients, however, errors or other transients occur at the filter output due to the coefficient change. These effects are especially a problem for higher order IIR filters which have many internal nodes.

In a digital signal processing (DSP) radio receiver, a digital channel filter is applied to an intermediate frequency (IF) signal to select the desired signal and reject other broadcast signals. A wide or a narrow passband may be used for the channel filter depending upon the presence of adjacent or alternate channel broadcast signals. When switching between the two bandwidths by switching between two coefficient sets in a DSP filter, resulting transients can cause audible pops and/or clicks which are unacceptable.

SUMMARY OF THE INVENTION

The present invention has the advantage of reducing transient effects when switching filter coefficient sets by coordinating the design of the two coefficient sets.

In one aspect of the invention, a switched bandwidth digital filter selectively provides a first bandwidth characteristic or a second bandwidth characteristic. A plurality of filter sections are cascaded in series between an input and an output, wherein each filter section has a section output providing a respective node of the digital filter. A first coefficient set for loading into the filter sections produces the first bandwidth characteristic and provides respective net gains between the input and each of the nodes. A second coefficient set for loading into the filter sections produces the second bandwidth characteristic and provides respective net gains between the input and each of the nodes. According to the present invention, the net gains in at least one of the nodes provided by the first and second coefficient sets are substantially matched, resulting in reduced transient effects when switching between the first and second coefficient sets.

BRIEF DESCRIPTION OF THE DRAWINGS

FIG. 4 shows the internal structure of a channel filter.

FIG. 5 is a flowchart showing prior art filter design techniques to obtain a filter coefficient set.

DETAILED DESCRIPTION OF PREFERRED EMBODIMENTS

Figure 1:
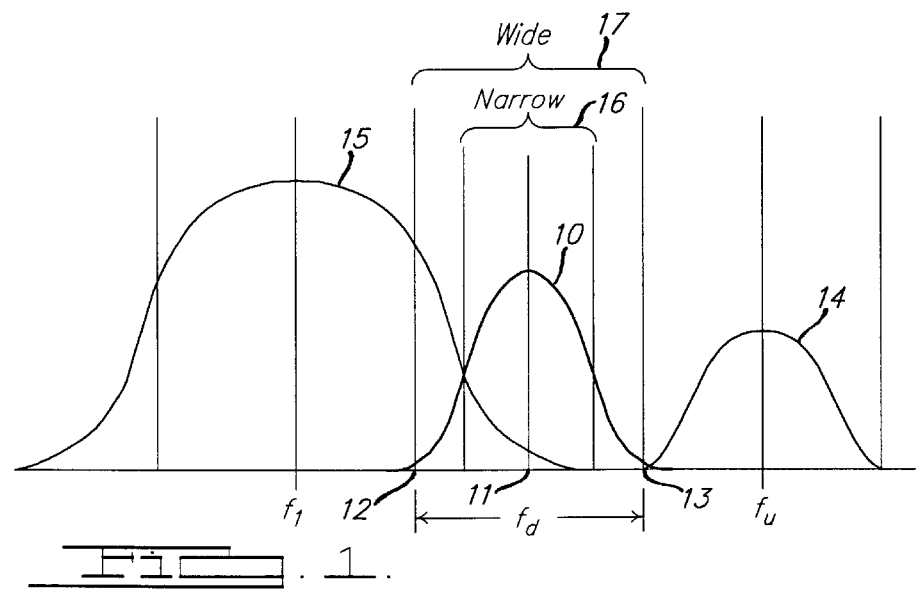
FIG. 1 plots reception field strength in a local reception area in which adjacent channel interference exists for a desired radio channel of interest.

FIG. 1 shows a frequency spectrum 10 of a desired radio broadcast having a center frequency 11 and occupying an assigned channel $f_d$ between a lower frequency 12 and an upper frequency 13. An upper adjacent channel $f_u$ is shown containing a broadcast signal 14 with substantially no excess signal content in the desired frequency channel, whereby the upper adjacent channel is not causing interference. However, a lower adjacent channel at $f_1$ is shown to include a radio broadcast having a frequency spectrum 15 including significant signal content above lower frequency 12 of the desired channel. The resulting interference degrades reception of the desired radio broadcast.

Adjacent channel interference can be reduced by means of narrowing the passband of a bandpass filter in the receiver to reduce the signal content from the adjacent channel passing through the receiver. Thus, FIG. 1 shows a narrow bandwidth 16 which can be switched into the intermediate frequency signal path to alleviate adjacent channel interference. When no adjacent channel interference is present, a wide bandwidth 17 is used in order to maximize quality of the received desired signal. Within the receiver, center frequency 11 is translated to an intermediate frequency, which may be a zero intermediate frequency. In that case, the filter is a lowpass filter.

Figure 2:
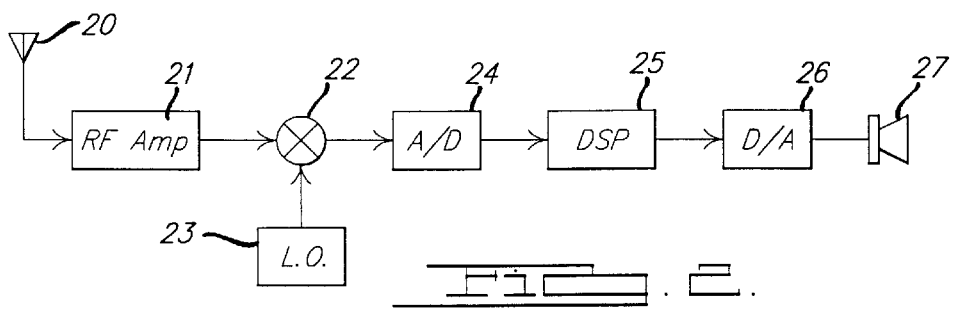
FIG. 2 is a block diagram showing portions of a DSP radio receiver.

FIG. 2 is a block diagram showing a radio receiver using digital signal processing. An antenna 20 receives broadcast RF signals which are coupled to an RF amplifier 21. Amplified RF signals are provided to one input of a mixer 22. A local oscillator 23 provides a mixing signal to a second input of mixer 22, the mixing signal having a frequency under control of a tuning control circuit (now shown). A carrier-based signal in the form of an intermediate frequency (IF) signal is provided from mixer 22 to the input of an analog-to-digital (A/D) converter 24. A digitized IF signal is provided to digital signal processor (DSP) block 25 for filtering, demodulating and other further processing of the resulting audio signal. A final audio signal is output from DSP 25 to the input of a digital-to-analog (D/A) converter 26 which provides analog audio signals to a speaker system 27.

Figure 3:
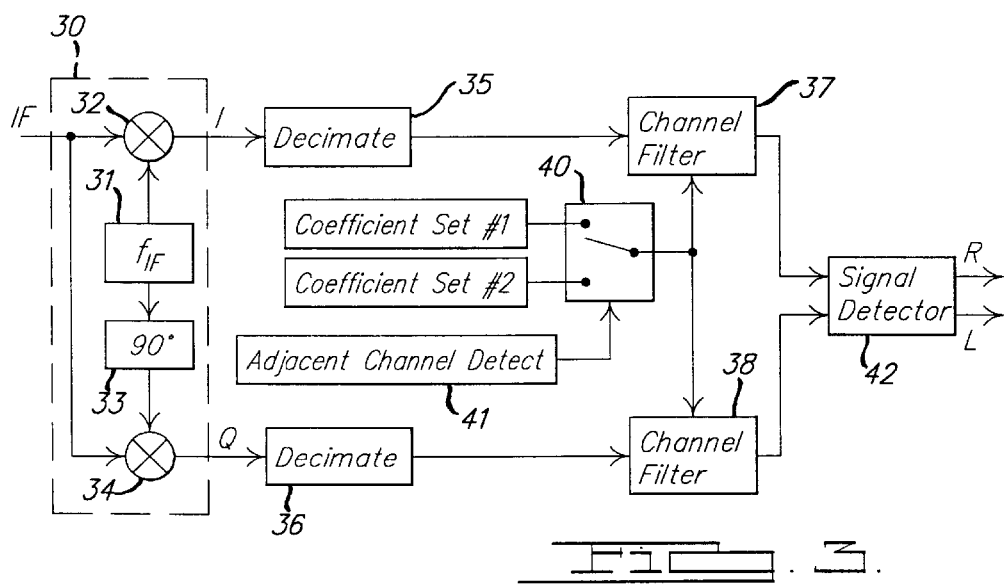
FIG. 3 is a block diagram showing DSP processing of an intermediate frequency signal as used in the present invention.

Processing of the digitized IF signal within DSP 25 is shown in greater detail in FIG. 3. The embodiment of FIG. 3 is particularly adapted for processing AM signals. The digitized IF signal is provided to the input of a complex mixer 30 to produce in-phase (I) and quadrature-phase (Q)

signals. An oscillator 31 produces an injection signal $f_{if}$ which is nominally equal to the intermediate frequency of the IF signal so that the IF signal is mixed to a new IF frequency of approximately zero Hertz. The injection signal is coupled directly to one input of a first mixer 32 and through a 90° phase-shift block 33 to an input of a second mixer 34. The digitized IF signal is provided to respective inputs of mixers 32 and 34 to generate the I and Q signals. The I and Q signals are decimated by decimate blocks 35 and 36, respectively, to provide sample-rate-reduced signals to the inputs of channel filters 37 and 38.

Other non-zero IF frequencies or non-complex signal representations can be used with the present invention. However, a zero-IF complex representation has many advantages in DSP processing such as compact code size, minimized chip area, and efficient data manipulation.

Channel filters 37 and 38 are loaded with either a coefficient set #1 or a coefficient set #2 through a multiplexer 40 under control of an adjacent channel detect block 41. One coefficient set provides a wide bandwidth while the other coefficient set provides a narrow bandwidth. A coefficient set to be used at any one time is selected depending upon the presence of adjacent channel interferers. Using a zero Hertz intermediate frequency, channel filters 37 and 38 are implemented as lowpass filters with the narrower filter having an upper cutoff frequency which is lower than that of the wider filter. The presence of adjacent channel interferers can be detected using any conventional method as known in the art. The filtered outputs of channel filters 37 and 38 are provided to a signal detector 42 for generating an audio output which may include left and right stereo signals, for example.

The channel filters may be implemented using various filter structures and types. An infinite impulse response (IIR) filter as shown in FIG. 4 will be described herein as an example since its use may be desirable for its advantages of compact size and since it is especially vulnerable to large transient effects when switching coefficient sets. However, the present invention is also useful for reducing transients with other filter structures whenever cascaded filter sections (e.g., cascades of FIR or FIR and IIR sections) are being used.

FIG. 4 shows a typical architecture for an IIR filter comprising three second-order sections cascaded in series between an input x(n) and an output y(n). A filter may include an overall gain term $G_0$ applied to one input of a multiplier 45 which receives input x(n) at its other input. Alternatively, the gain term $G_0$ may be distributed to the individual sections as is known in the art.

Second order sections 46, 47 and 48 are connected in series to produce a sixth order filter. First section 46 includes a multiplier 50 for multiplying the input to section 46 by a coefficient $b_{0,1}$. The resulting product is provided to one input of a summer 51. The output of summer 51 provides the output node for section 46, and is also an internal node of the whole filter.

The input to section 46 is delayed by one sample period in a unit delay block 52 and then input to a multiplier 53. Coefficient $b_{1,1}$ is applied to a second input of multiplier 53 and the output is provided to summer 51. The output of unit delay block 52 is passed through a further unit delay in unit delay block 54 prior to multiplying it in a multiplier 55 by a coefficient $b_{2,1}$. The output of multiplier 55 is provided to yet another input of summer 51. The b coefficients provide the feedforward terms for section 46. Section 46 also includes feedback terms wherein the output of summer 51 is delayed in a unit delay block 56. The delayed output is coupled to a multiplier 57 which also receives a coefficient $a_{1,1}$. The output of multiplier 57 is coupled to another input of summer 51. The delayed output from unit delay block 56 is passed through a unit delay block 58 and then to an input of a multiplier 59. Coefficient $a_{2,1}$ is supplied to another input of multiplier 59 and the resulting product is coupled to summer 51. The output of summer 51, comprising the internal node for the first section 46, is coupled to the input of second section 47. Sections 46 and 47 are shown overlapping since unit delay blocks 56 and 57 are shared between the two section operations in order to minimize hardware requirements.

The input of section 47 (from summer 51) is applied to a multiplier 60 which also receives coefficient $b_{0,2}$. Additional b coefficients $b_{1,2}$ and $b_{2,2}$ are applied to multipliers 62 and 63, respectively, and the resulting products are added in a summer 61. Unit delay block 64, multiplier 65, unit delay block 66, and multiplier 67 provide feedback terms using coefficients $a_{1,2}$ and $a_{2,2}$, as in the previous section. Section 48 operates in the same manner using b coefficients for the third section $b_{0,3}$ $b_{1,3}$ and $b_{2,3}$ and a coefficients $a_{1,3}$ and $a_{2,3}$. In order to provide a final filtering of higher order, more second order sections may be cascaded in series after section 48.

Various methods are known for determining appropriate values for the a and b coefficients. A typical procedure is shown in FIG. 5. In step 80, a filter designer selects a desired filter type, such as a lowpass or bandpass filter. The type of filter structure may also be selected such as a Butterworth, Chebyshev, or elliptic filter structure. In step 81, a cutoff frequency or frequencies are selected and in step 82 the number of second order sections to be used is selected. These parameters are used in step 83 for performing a process for obtaining a final coefficient set using available software filter design packages, such as the SPW filter designer from Cadence Design Systems, Inc. A typical design package includes calculating a transfer function for the filter and factoring the transfer function to obtain the second order sections. In addition, it is known in the art to re-order the resulting sections and to distribute the gain terms within the re-ordered sections to maximize dynamic range. These additional steps may be part of an improved design package or may be done manually by the filter design expert. As used herein, dynamic range is the range of allowable signal levels that can exist within the filter such that 1) a certain maximum signal level is not exceeded in order to avoid clipping, and 2) a certain minimum signal level is maintained in order to sustain a minimum signal-to-noise ratio (a possible noise source is due to truncation or rounding during filter computations).

Using a prior art process as shown in FIG. 5, first and second coefficient sets may be separately derived for providing a first bandwidth characteristic and a second bandwidth characteristic, respectively, in order to switch a filter between bandwidths while using the same filter hardware and structure as shown in FIG. 3. Thus, by swapping coefficient values between the two coefficient sets, either the wide bandwidth or the narrow bandwidth channel filter can be selected. As used herein, a coefficient set refers to all the a and b coefficients for all the filter sections for providing one bandwidth characteristic. Although switching between different bandwidths is described herein, the first and second filter characteristics could alternatively provide identical bandwidths but different phase responses (and the present invention would apply in the same manner).

Using the coefficient sets as obtained with the process of FIG. 5, significant transients occur at the filter output immediately after the filter coefficients are changed. It has been found that the reason for the transients is that at the time of the coefficient switching, the internal nodes of the filter retain signal quantities derived from processing using one coefficient set before the switch and then these quantities are acted upon by different coefficients after the switch. Using coefficient sets derived using prior art methods, the individual signal gains for a particular selection will not be matched between the two coefficient sets. Therefore, signal quantities propagating through the filter during the coefficient switching are acted on by a total gain different from the total desired gain of either filter alone.

The gain mismatch may be most important at a particular frequency or frequencies of interest. In a DSP radio receiver employing a zero Hertz intermediate frequency, for example, the main frequency of interest is zero Hertz (i.e., DC). Thus, if the two coefficient sets provide DC gains within each section which are significantly different, the DC content of the filtered signal during the coefficient switching process will have a large transient. Where the radio signal is an AM signal, the transient causes an error in the carrier level which may significantly perturb subsequent signal processing such as AGC and AM detection, resulting in audio glitches or pops.

The solution of the present invention is to adjust the two coefficient sets in a manner to minimize internal gain mismatches at a set of one or more frequencies of interest. In a preferred embodiment, the present invention employs a filter design process using a reordering of cascaded sections and scaling section gains (e.g., by adjusting the feedforward filter coefficients or adding a separate gain control for each section). However, the overall objective of substantially matching the net gain at each internal node of the filter can be achieved either with or without reordering of the sections.

The present invention employs prior art procedures to calculate preliminary coefficient values for the first and second coefficient sets. The preliminary coefficients are modified within a section of one of the coefficient sets to substantially match a resulting net gain at a predetermined node with a net gain produced at the predetermined node by the other one of the coefficient sets.

FIGS. 6–9 illustrate frequency spectra for four different coefficient sets each having four second-order sections. Individual sections may be characterized in terms of their Q (i.e., the amount of peaking near their cutoff frequency). There will also exist a net Q from the filter input to each internal node.

Figures 7A, 7B, 7C, 7D:
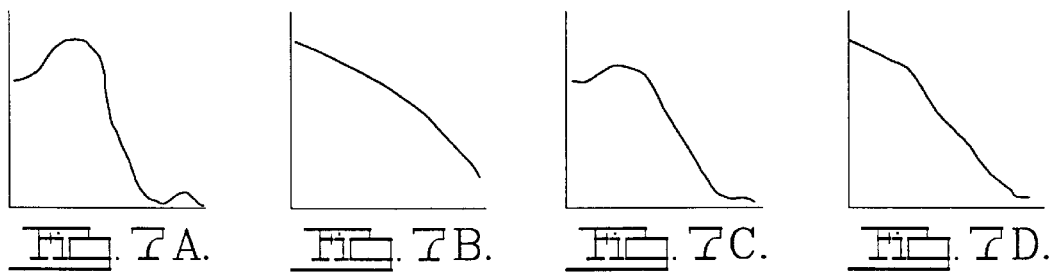
FIGS. 7A–7D show sequential filter section Q's according to a second coefficient set for providing a narrower passband than the filter of FIGS. 5A–5D.
Figures 8A, 8B, 8C, 8D:
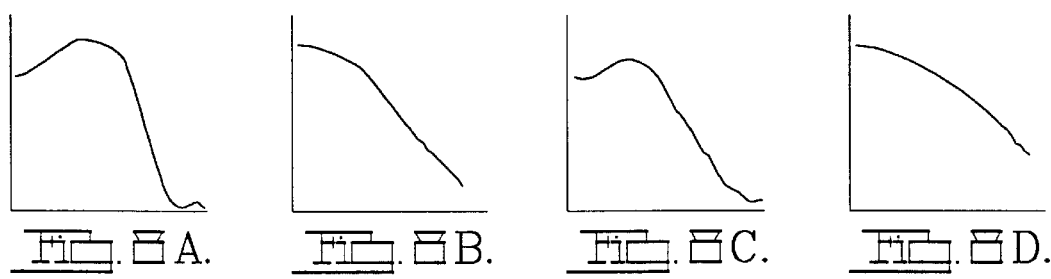
FIGS. 8A–8D show a reordering of filter sections and their Q's in FIGS. 5A–5D according to the present invention.
Figures 9A, 9B, 9C, 9D:
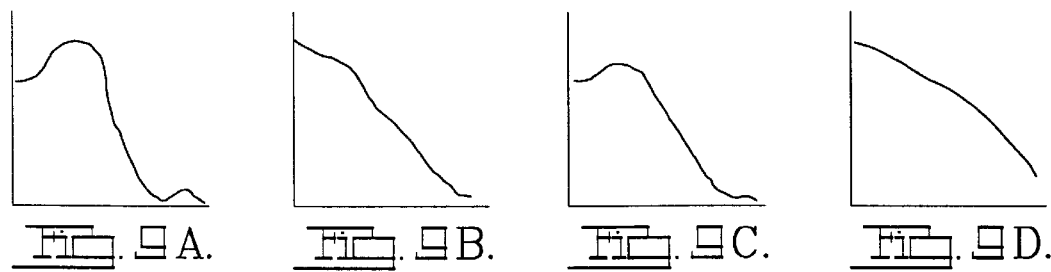
FIGS. 9A–9D show a reordering of filter sections and their Q's in FIGS. 7A–7D according to the present invention.

FIGS. 6A–6D show frequency spectra corresponding to preliminary coefficients for the first coefficient set as determined for a cascade of four second-order filter sections providing the wideband channel filter. FIGS. 7A–7B show the spectra of individual filter sections corresponding to preliminary coefficients for the second coefficient set as determined for the narrowband channel filter. As derived from conventional techniques, the spectra of FIGS. 6 and 7 may be provided in an order which tries to maximize use of the dynamic range of each filter separately. In order to facilitate gain matching between the two filters at internal nodes as used in the present invention, a reordering of filter sections may be desirable in order to better match net Q's at each internal node of the filter between sections. The reordering according to net Q brings the net gains into better matching and reduces the amount of gain change which needs to be achieved by adjusting the coefficient values. In one approach, the sections of one filter are re-ordered in order to match its net Q's to those of the other filter. In another approach, the sections of both filters are re-ordered, perhaps trading off some dynamic range performance in order to reduce switching transients even more.

FIGS. 8A–8D are a reordering of the filter sections shown in 6A–6D. FIGS. 9A–9D are obtained from a reordering of FIGS. 7A–7D. In particular, FIGS. 8A to 8D correspond to a re-ordering as follows: FIG. 6D, FIG. 6B, FIG. 6A, and FIG. 6C. Similarly, FIGS. 9A to 9D correspond to a re-ordering as follows: FIG. 7A, FIG. 7D, FIG. 7C, and FIG. 7B. Thus, net gain is best matched in terms of the overall spectrum of the filter. The next step after possible re-ordering of the sections is gain distribution, which may preferably be performed for a specific frequency or frequencies of interest (e.g., at DC in a filter included in a zero-hertz IF processing section of a radio receiver).

Figures 9, 10:
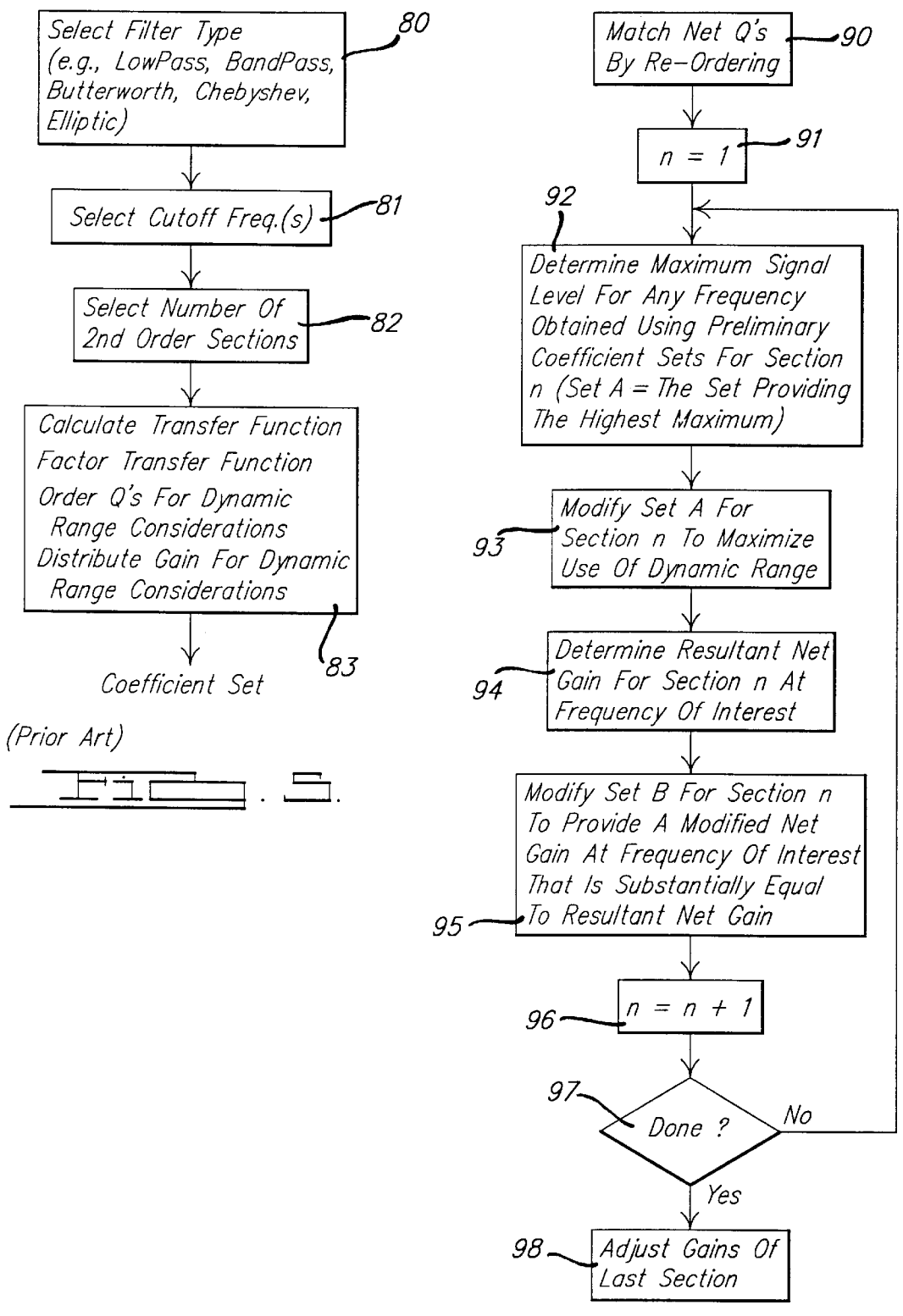
FIG. 10 is a flowchart showing a preferred method of the present invention for modifying filter coefficient sets so as to match net gain provided at internal nodes of the filter.
Figures 6A, 6B, 6C, 6D:
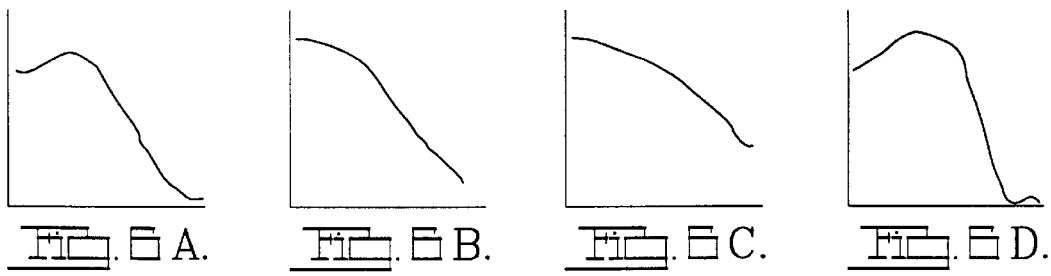
FIGS. 6A–6D show Q's or spectra for sequential filter sections having coefficients obtained using conventional filter design techniques.

The improved method of the present invention is shown in greater detail in FIG. 10. In step 90, filter sections are reordered in order to substantially match net Q's at the internal nodes between the first and second preliminarily-obtained coefficient sets. Using the reordered sections, the sections are considered in sequential order to modify coefficients as necessary to substantially match net gain provided at each node for the frequency of interest. In step 91, an index n is set to n=1 so that the first filter section is considered first. In step 92, the maximum signal level obtained at any frequency is determined for each of the preliminary coefficient sets. This is determined using the range of possible input values to section n (i.e., the input range of the filter as modified by any filter sections prior to section n). Whichever coefficient set provides the highest maximum signal level, is designated as set A. In step 93, the coefficients for set A in section n are modified to maximize the use of the dynamic range over the full frequency range of the section (i.e., the gain is adjusted until the highest maximum falls just below clipping). Based on this adjusted gain, a resultant net gain results at the frequency of interest, which is determined in step 94. Transients are avoided during switching of coefficient sets if the net gain at the set of one or more frequencies of interest stays substantially constant before and after switching. Thus, in step 95, coefficients in set B for section n are modified to provide a modified net gain at the frequency of interest which is substantially equal to the resultant net gain of set A. These gain changes may be obtained by distributing gain from an overall gain term (such as overall gain $G_0$ shown in FIG. 4) or gain can be shifted between sections or compensated for by an additional gain term introduced into the cascade.

It is possible that after adjusting the set B coefficients, set B may be clipping at some frequency. If so, then it is necessary to lower the gain of set B to eliminate the clipping and then to lower the gain of set A by the same amount.

Index value n is incremented by one in step 96 and a check is made in step 97 to determine whether all sections prior to the last filter sections have been modified. If there is a remaining section then a return is made to step 92, otherwise a final gain adjustment for the last section is performed in step 98. Thus, any leftover gain (i.e., any difference between the net gain through to the final internal node at the output of the penultimate filter section and the overall gain desired for the total filter) is distributed to the last filter section. As in adjusting the gain within any section, the gain is distributed to a section by scaling the feedforward coefficients (i.e., the b coefficients) as required. For example, a 10% increase in gain would be achieved by a 10% increase in the feedforward b coefficients. Minor adjustment of the coefficients may be made using an iterative approach in order to trade off between gain matching and dynamic range performance.

Although the foregoing examples show matching in terms of net gain and Q, matching may also be performed for phase delay. Thus, a net phase delay at each node may be substantially matched. Phase delay can be adjusted by appropriate modification of the a and b coefficients. Furthermore, matching may be performed for a combination of net gain and phase delay or any other desired matching criteria.

What is claimed is:

1. A switched bandwidth digital filter selectably providing a first bandwidth characteristic or a second bandwidth characteristic, comprising:

a plurality of filter sections cascaded in series between an input and an output, each filter section having a section output providing a respective node of said digital filter;

a first coefficient set for loading into said filter sections to produce said first bandwidth characteristic, wherein said first coefficient set provides respective net gains between said input and each of said nodes; and a second coefficient set for loading into said filter sections to produce said second bandwidth characteristic, wherein said second coefficient set provides respective net gains between said input and each of said nodes;

wherein net gains at at least one of said nodes provided by said first and second coefficient sets are substantially matched in order to reduce transient effects when switching between said first and second coefficient sets.

2. The digital filter of claim 1 wherein said net gains are substantially matched for a predetermined set of one or more frequencies of interest.

3. A switched bandwidth digital filter selectably providing a first bandwidth characteristic or a second bandwidth characteristic, comprising:

a plurality of filter sections cascaded in series between an input and an output, each filter section having a section output providing a respective node of said digital filter;

a first coefficient set for loading into said filter sections to produce said first bandwidth characteristic, wherein said first coefficient set provides respective net gains and respective net Q's between said input and each of said nodes; and a second coefficient set for loading into said filter sections to produce said second bandwidth characteristic, wherein said second coefficient set provides respective net gains and respective net Q's between said input and each of said nodes;

wherein net Q's at at least one of said nodes provided by said first and second coefficient sets are substantially matched.

4. The digital filter of claim 3 wherein said net gains at at least one of said nodes provided by said first and second coefficient sets are substantially matched.

5. A switched bandwidth digital filter selectably providing a first bandwidth characteristic or a second bandwidth characteristic, comprising:

a plurality of filter sections cascaded in series between an input and an output, each filter section having a section output providing a respective node of said digital filter;

a first coefficient set for loading into said filter sections to produce said first bandwidth characteristic, wherein said first coefficient set provides respective net phase delays between said input and each of said nodes; and a second coefficient set for loading into said filter sections to produce said second bandwidth characteristic, wherein said second coefficient set provides respective net phase delays between said input and each of said nodes;

wherein net phase delays at at least one of said nodes provided by said first and second coefficient sets are substantially matched in order to reduce transient effects when switching between said first and second coefficient sets.

6. The digital filter of claim 5 wherein said net phase delays are substantially matched for a predetermined set of one or more frequencies of interest.

7. A method of obtaining a first coefficient set and a second coefficient set for loading into a plurality of filter sections cascaded in series between an input and an output to form a switched bandwidth digital filter selectably providing a first bandwidth characteristic or a second bandwidth characteristic, respectively, wherein each filter section has a section output providing a respective node of said digital filter, said method comprising the steps of:

selecting a functional filter type;

selecting a number of filter sections;

calculating preliminary coefficient values for said functional filter type for said first and second coefficient sets; and modifying coefficients within one of said coefficient sets to substantially match a resulting net gain at a predetermined node with a net gain produced at said predetermined node by the other one of said coefficient sets.

8. The method of claim 7 wherein, prior to said modifying-step, coefficients corresponding to said filter sections within said first and second coefficient sets are re-ordered to substantially match each net Q produced by said first and second coefficient sets at each of said nodes.

9. The method of claim 7 wherein said modifying step is comprised of the following steps applied to each of said filter sections sequentially from a first filter section to a penultimate filter section:

modifying coefficients within one of said coefficient sets for said filter section to substantially maximize use of a dynamic range of said filter section, wherein said filter section then provides a resultant net gain for a predetermined set of one or more frequencies of interest; and modifying coefficients within the other one of said coefficient sets for said filter section to provide a modified net gain for said predetermined set of one or more frequencies of interest which is substantially equal to said resultant net gain from said one of said coefficient sets.

10. The method of claim 9 further comprising the step of:

modifying coefficients of said first and second coefficient sets corresponding to a last filter section as necessary to provide a desired overall gain of said digital filter.

* * * * *